United States Patent [19]
>
> Anthony
>
> [11] 4,386,429
> [45] May 31, 1983

[54] ALGAAS-ALGAASSB LIGHT EMITTING DIODES

[75] Inventor: Philip J. Anthony, Bridgewater, N.J.

[73] Assignee: Bell Telephone Laboratories, Incorporated, Murray Hill, N.J.

[21] Appl. No.: 219,509

[22] Filed: Dec. 23, 1980

[51] Int. Cl.³ ............................................... H01S 3/19
[52] U.S. Cl. ........................................ 372/45; 357/17; 357/61
[58] Field of Search ...................... 372/45, 46; 357/16, 357/17, 61

[56] References Cited

PUBLICATIONS

Olsen et al., "Calculated Stresses in Multilayered Heteroepitaxial Structures", *JAP*, vol. 48, No. 6, Jun. 1977, pp. 2543–2547.
Casey et al., "Binary and Quaternary Systems", *Heterostructure Lasers*, Part B, 1978, pp. 38–41 and 56–57.
Nahory et al., "Continuous Operation of Lo-μm-Wavelength $GaAs_{1-x}Sb_x/Al_yGa_{1-y}As_{1-x}Sb_x$ Double Heterostructure Injection Lasers at Room Temperature", *APL*, vol. 28, No. 1, Jan. 1, 1976, pp. 19–21.
Dierschke, "High-Efficiency GaAsSb/GaAlAsSb Double-Heterostructure Hemispherical Infrared Emitting Diodes", *IEEE Transactions on Electron Devices*, vol. ED-26, No. 8, Aug. 1979, pp. 1211–1214.
Rogulin et al., "Near-Infrared Spontaneous Radiation Sources Based on $GaSb_xAs_{1-x}$ Solid Solution", *Sov. Phys. Semicond.*, vol. 8, No. 10, Apr. 1975, pp. 1332–1333.
Sugiyama et al., "GaAsSb-AlGaAsSb Double Heterojunction Lasers", *Japan Journal of Applied Physics*, 1972, pp. 1057–1058.
Antypas et al., "Liquid Epitaxial Growth of GaAsSb and Its Use as a High-Efficiency, Long-Wavelength Threshold Photoemitter", *JAP*, vol. 41, No. 5, Apr. 1970, pp. 2165–2171.
Chaminant et al., "Growth and Properties of GaAsSb/GaAlAsSb Double Heterostructure Lasers", *Solid-State and Electron Devices*, vol. 3, No. 6, Nov. 1979.

*Primary Examiner*—James W. Davie
*Attorney, Agent, or Firm*—Michael J. Urbano

[57] ABSTRACT

Disclosed are double heterostructure junction lasers and incoherent LEDs in which the active region comprising $Al_zGa_{1-z}As_{1-y}Sb_y$ $0.001 \leq y \leq 0.02$ and in which the cladding layers comprise $Al_xGa_{1-x}As$, $(x-z) \geq 0.20$. Long lifetime lasers operating at wavelengths in the vicinity of 0.87–0.92 μm are realized. Visible wavelength lasers and LEDs are also discussed.

13 Claims, 3 Drawing Figures

ALGAAS-ALGAASSB LIGHT EMITTING DIODES

BACKGROUND OF THE INVENTION

This invention relates to light emitting diodes including laser diodes and incoherent LEDs.

In the last decade, significant improvements in three essential components underlie the maturation of optical communications systems from laboratory curiosities to commercial realities. These components are double heterostructure (DH) semiconductor light sources capable of continuous wave (CW) operation at room temperature, glass optical fiber having low optical loss windows at wavelengths matching the source emission, and low noise detectors capable of efficiently converting the transmitted radiation to a corresponding electrical signal.

The low loss windows of commercially available optical fibers typically occur at about 1.1 $\mu$m, 1.3 $\mu$m, and 1.55 $\mu$m where the absorption loss (primarily due to OH in the fiber material) is $\leq 1$ db/km. Early in the decade, workers recognized the obvious advantages of fiber optic transmission in the longer wavelength windows; and accordingly they fabricated, with varying degrees of success, DH lasers for operation in that range. Their attention was directed primarily to two materials systems:

$InP-In_{1-x}Ga_xAs_{1-y}P-InP$ and $Al_xGa_{1-x}As_{1-y}Sb_y-GaAs_{1-y}Sb_y-Al_xGa_{1-x}As_{1-y}Sb_y$.

The $GaAs_{1-y}Sb_y$ DH lasers typically contained relatively large amounts of Sb ($y \approx 0.12$–$0.15$) to shift the wavelength to $\sim 1$ $\mu$m and were step-graded to GaAs substrates to provide stress relief. As summarized by H. C. Casey, Jr. and M. B. Panish, *Heterostructure Lasers*, Part B, Academic Press (1978) at pages 38–41 and 56–57, respectively, DH lasers in both of these systems have been operated CW at room temperature, but lattice matching problems in the GaAsSb system, and the ability to generate longer wavelengths (e.g., 1.1–1.6 $\mu$m) in the InGaAsP system, have combined to render it unlikely that long wavelength GaAsSb lasers grown on GaAs substrates will ever see commercial use.

On the other hand, the easiest materials system from which to make heterostructure light sources, LEDs or lasers, is the $Al_xGa_{1-x}As$ system because of the extremely close, albeit not perfect, lattice match between GaAs and AlAs. Unfortunately, $Al_xGa_{1-x}As$ sources produce light at wavelengths shorter than about 0.9 $\mu$m and thus are constrained to operate at wavelengths below the 1.1 $\mu$m window where fiber losses are typically 3 db/km. In fact, $Al_xGa_{1-x}As-Al_yGa_{1-y}As-Al_xGa_{1-x}As$ DH lasers with the best reliability to date have $y \sim 0.07$ in the active layer and thus emit light at $\sim 0.82$ $\mu$m in the infrared. These lasers are more than two orders of magnitude more reliable than similar lasers with $y=0$ (pure GaAs active layer). However, if reliable lasers could be made in the $Al_xGa_{1-x}As$ materials system that emit light at, or slightly longer than, the pure binary GaAs wavelength of 0.87 $\mu$m, then the practical advantage of the close lattice match would be preserved, and the corresponding fiber loss could be improved from about 3 db/km to 2 db/km. Accordingly, longer fiber optic links and/or longer distances between repeaters in fiber optic systems would be made possible.

On the other hand, when $z \geq 0.15$ in the active layer of $Al_zGa_{1-z}As$ heterostructure light sources, the emission is at visible wavelengths (e.g., $\leq 0.78$ $\mu$m). Emission at such short wavelengths is generally not suitable for present-day fiber optic transmission because the optical absorption would be very high (of the order of 10 db/km). But, such visible wavelength lasers might be useful in other applications, for example video discs, where the shorter wavelength advantageously increases information storage density.

SUMMARY OF THE INVENTION

In accordance with an illustrative embodiment of my invention, a relatively small, controlled amount of Sb is added to the $Al_zGa_{1-z}As_{1-y}Sb_y$ active layer of a DH light source, laser or incoherent LED, with $Al_xGa_{1-x}As$ cladding layers in order to place the active layer under compression at the operating temperature. This result is attained when the amount of Sb added satisfies $0.001 \leq y \leq 0.02$ for both infrared sources ($z \leq 0.15$) and visible sources ($z \leq 0.15$). Enhanced lifetimes result from this scheme.

In particular, I have found that the addition of these small, controlled amounts of Sb to the GaAs active layer of a DH laser with AlGaAs cladding layers not only places the active layer under compression at the operating temperature of the laser but at the same time yields the desired longer wavelength infrared emission useful for fiber optic transmission. These lasers have also exhibited enhanced median lifetimes compared to similar lasers with pure GaAs active layers with the best results occurring when the lattice mismatch between the active and cladding layers is essentially zero.

In a preferred embodiment, a light emitting diode, DH laser or incoherent LED, in accordance with my invention comprises a pair of opposite conductivity type $Al_xGa_{1-x}As$ cladding layers with an intermediate region between and contiguous with the cladding layers and including an active layer of $Al_zGa_{1-z}As_{1-y}Sb_y$, $0.001 \leq y \leq 0.02$ capable of generating radiation when the cladding layers are forward biased.

The approximate lower limit of $y=0.001$ is the minimum amount of Sb which places the active layer under compression for typical values of x (e.g., $0.2 \leq x \leq 0.6$) and typical layer thicknesses. On the other hand, the approximate upper limit of $y=0.02$ is related to the need to avoid introduction of excessive misfit dislocations in the layers at the growth temperature used.

Furthermore, I have found that in the liquid phase epitaxy (LPE) fabrication of these lasers, the addition of this small amount of Sb to the active layer growth melt apparently improves the initial nucleation and growth uniformity of the active layer.

BRIEF DESCRIPTION OF THE DRAWING

These and other objects of my invention, together with its various features and advantages, can be more easily understood from the following more detailed description, taken in conjunction with the accompanying drawing, in which.

DETAILED DESCRIPTION

Figure 1:
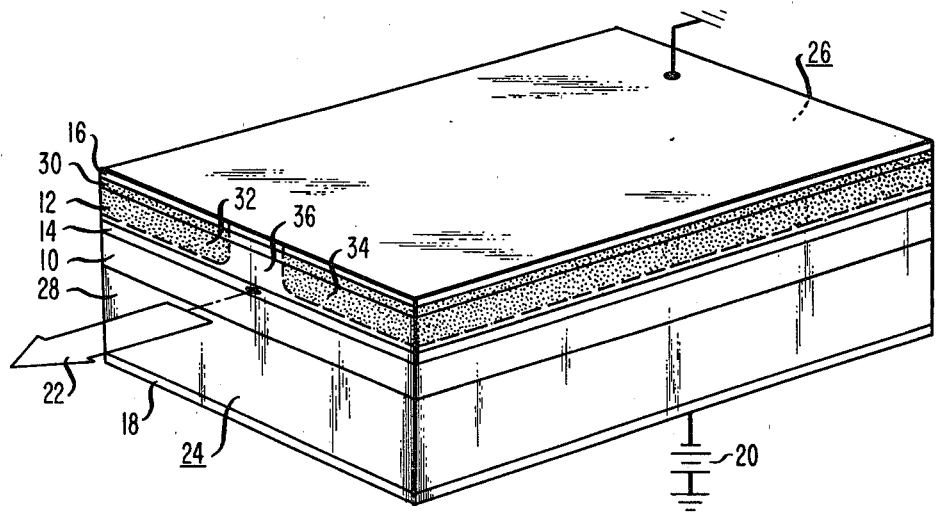
FIG. 1 is an isometric view of a DH laser in accordance with an illustrative embodiment of my invention. In the interests of clarity, this figure has not been drawn to scale.

Before discussing my invention in detail, it will be helpful to discuss first the general configuration of a double heterostructure (DH) semiconductor light emitting diode. As shown in FIG. 1, a DH comprises first and second relatively wide bandgap, opposite conductivity type, semiconductor cladding layers 10 and 12, respectively, and essentially latticed matched thereto an intermediate region 14 which is between and contiguous with the cladding layers. The intermediate region 14 includes a narrower bandgap active layer, here shown to be coextensive with the region 14, capable of emitting radiation when the cladding layers are forward biased. From the standpoint of quantum efficiency, the active layer is preferably a direct bandgap semiconductor.

Electrode means, illustratively contacts 16 and 18, is provided along with a voltage source 20 to forward bias the cladding layers and thereby to inject carriers into the active layer 14. These carriers recombine to generate spontaneous radiation in the case of an incoherent LED or stimulated radiation in the case of a laser. In either case, however, the radiation has a wavelength corresponding to the bandgap of the active layer material. Moreover, in the case of a laser the radiation 22 is emitted in the form of a collimated beam perpendicular to a pair of mirrors 24 and 26 formed illustratively by cleaved crystal facets or etched surfaces. These mirrors constitute optical feedback means for generating stimulated radiation. In other applications, for example integrated optics, diffraction gratings may be employed as a substitute for one or both of the mirrors.

Although the electrode means depicted in FIG. 1 includes broad area contacts 16 and 18, it is well known in the art that these contacts can be patterned to form various geometrical shapes, such as circular dots and annular rings, which are suitable, for example, for incoherent LEDs in which the radiation is emitted essentially isotropically rather than in the form of a collimated beam.

The conductivity type of the active layer is not critical. It may be n-type, p-type, intrinsic or compensated since in typical modes of operation under forward bias the number of injected carriers may exceed the doping level of the active layer. In addition, the intermediate region 14 may include a multiple of layers which constitute an active region, e.g. contiguous p- and n-type layers of the same bandgap forming a p-n homojunction or of a different bandgap forming a p-n heterojunction. Furthermore, the heterostructure may take on configurations other than the simple double heterostructure including, by way of example but without limitation, separate confinement heterostructures as described by I. Hayashi in U.S. Pat. No. 3,691,476, strip buried heterostructures of the type described by R. A. Logan and W. T. Tsang in U.S. Pat. No. 4,190,813, and isotype heterostructures of the type described by R. L. Hartman et al U.S. Pat. No. 4,313,125.

For CW laser operation at room temperature, the thickness of the active layer is preferably between approximately $\lambda/2$ and 1.0 $\mu m$, where $\lambda$ is the wavelength of the radiation as measured in the semiconductor. For low threshold operation, the thickness is typically 0.12 to 0.20 $\mu m$. However, for incoherent LED operation a thicker active layer, typically 2 to 3 $\mu m$, is suitable. In either case, for room temperature operation the laser or LED is typically bonded to a suitable heat sink, not shown.

In practice the layers of a double heterostructure are typically grown by an epitaxial process such as liquid phase epitaxy (LPE), molecular beam epitaxy (MBE), or metallo-organic chemical vapor deposition (MOCVD). Epitaxial growth takes place on a single crystal substrate 28 which may include a buffer layer (not shown) between the substrate 28 and the first cladding layer 10. Also, a contact facilitating layer 30 is optionally included between the second cladding 12 and the top contact 16. The opposite contact 18 is formed on the bottom of substrate 28.

In order to constrain the pumping current generated by source 20 to flow in a relatively narrow channel 36 (e.g., 5-12 $\mu m$ wide for a laser) through the active region 14, laterally separate, high resistivity zones 32 and 34 are formed in the semiconductor layers, illustratively in layers 12 and 30, by means well known in the art. Techniques for forming zones 32 and 34 include, for example, proton bombardment, oxygen bombardment, or suitable etching and regrowth of high resistivity material. Alternatively, the channel may be defined by a pair of laterally spaced, reversed biased p-n junctions with the space between the junctions being in registration with the channel 36, or by an oxide layer under contact 16 with a stripe opening in registration with the channel 36. Similar considerations apply to constraining current to flow in a narrow channel in LED structures, which, however, typically employ circular dot contacts to perform this function.

In accordance with an illustrative embodiment of my invention, in a DH light-emitting diode the cladding layers 10 and 12 comprise $Al_xGa_{1-x}As$ and the intermediate region 14 includes an $Al_zGa_{1-z}As_{1-y}Sb_y$ active layer with a small, controlled amount of Sb added to the active layer so that it is placed under compression at the operating temperature. To effect compression the thicknesses of the other layers of the device, as well as the thickness of the substrate and the operating temperature of the device, are mutually adapted with the amount of Sb by stress analysis techniques which are well known in the art (See, for example, G. H. Olsen et al, *Crystal Growth Theory and Techniques*, Vol. 2, Plenum, London (1977)). In the case where the diode is to operate in the infrared, the amount of Sb is advantageously small enough so that the free space radiation wavelength is essentially that of pure GaAs (i.e., 0.87-0.92 $\mu m$), thereby reducing the optical loss which would be experienced in commercially available fibers. On the other hand, for lasers especially, the amount of Sb is large enough that the reliability/lifetime of DH lasers with GaAsSb active regions is enhanced compared to similar lasers having essentially pure GaAs active regions. Similar lifetime enhancement is expected when the diode is designed to operate in the visible.

In a preferred embodiment the controlled amount of Sb added is such that $0.001 \leq y \leq 0.02$ so that the active layer is placed under compression, and in a further preferred embodiment the values of x and y are chosen to lattice match the active layer to the cladding layers as perfectly as possible; i.e., $y=0.0164(x-z) \approx 0.016(x-z)$.

As is well known in the art, (x−z) is also chosen large enough to provide adequate optical and carrier confinement in the active layer; that is, (x−z) typically satisfies $0.2 \leq (x-z) \leq 0.4$.

The lower limit of y=0.001 is approximately the minimum amount of Sb needed to place the active layer under compression, whereas the upper limit of y=0.02 is related to the need to avoid introducing excessive misfit dislocations in the layers at an LPE growth temperature of about 780 degrees Celsius. It is expected that this upper limit would increase at lower growth temperatures, and conversely.

The following example describes experiments performed on $Al_{0.4}Ga_{0.6}As-GaAs_{1-y}Sb_y-Al_{0.4}Ga_{0.6}As$ DH lasers in which reliability improvement was demonstrated for $0.004 \leq y \leq 0.02$. The best results occurred for $y \approx 0.006$ which, as seen from FIG. 2, essentially lattice matches the active layer to the $Al_{0.4}Ga_{0.6}As$ cladding layers.

Example

This example describes the fabrication of $GaAs_{1-y}Sb_y$ active layer DH lasers with $0.004 < y < 0.02$ that operated near 0.87 μm or longer wavelengths with extrapolated room temperature median lifetimes of about $10^5$ hours. Numerical parameters are provided by way of illustration only and, unless otherwise stated, are not intended to limit the scope of the invention.

The epitaxial layers 10, 12, 14, and 30 were grown by LPE near 780 degrees Celsius on Si-doped (100)-oriented 0.2 mm thick GaAs substrates 28 by the standard source-seed slider technique using a flowing He+11 percent $H_2$ ambient. The epitaxial layers of the laser structure comprised: a 3 μm thick, Te-doped, n-type, $Al_{0.4}Ga_{0.6}As$ cladding layer 10; a 0.1–0.4 μm thick, undoped, $GaAs_{1-y}Sb_y$ active layer 14; a 1.5 μm thick, Ge-doped, p-type $Al_{0.4}Ga_{0.6}As$ cladding layer 12; and a 0.5 μm thick, heavily Ge-doped, GaAs contacting layer 30. The material was analyzed for active layer nonuniformities using photoluminescence and photocurrent techniques and was processed into 380 μm long lasers with 5 μm wide stripes (channels 36) delineated by 150 keV proton bombardment of zones 32 and 34. These zones extended to a depth of about 1 μm and thus did not reach the active layer 14. Devices were bonded to gold-plated copper studs with In solder. No facet (mirror 24 or 26) coatings were used but could be employed if so desired.

Figure 2:
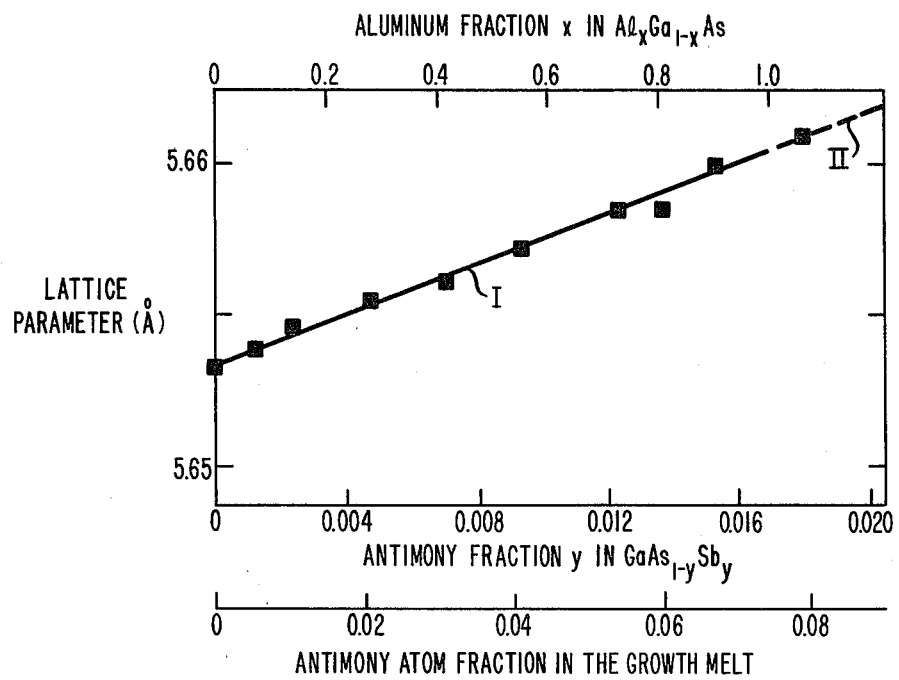
FIG. 2 is a graph of the lattice parameter of $Al_xGa_{1-x}As$ and $GaAs_{1-y}Sb_y$ versus both atom fraction of Sb in the growth melt, $X^{liq}$, and the resulting mole fraction y of Sb in the $GaAs_{1-y}Sb_y^{Sb}$ active layer. The latter correspondence is inferred from lattice parameter data and Vegard's law. The solid straight line (I) represents the lattice matched condition between the two compounds, but this line is dashed (II) beyond x=1.0 because that is the upper limit for the cladding layers (i.e., it corresponds to AlAs).
Figure 3:
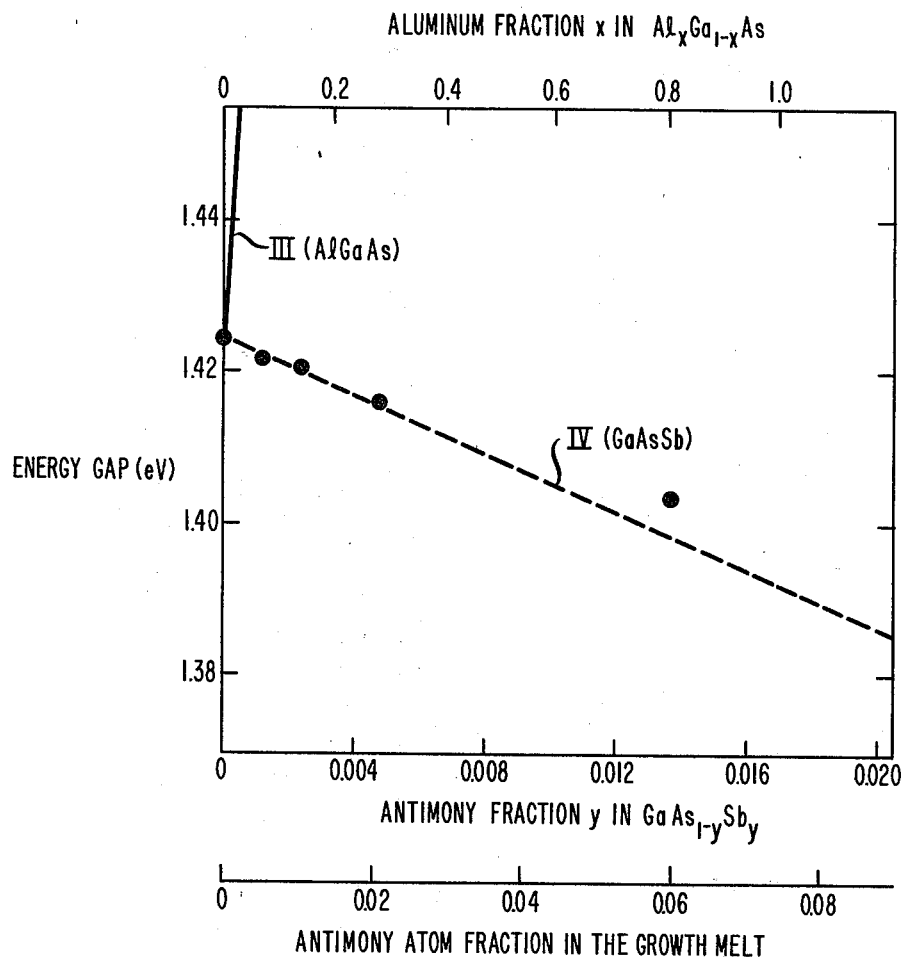
FIG. 3 is a graph of the bandgap energy of $Al_xGa_{1-x}As$ (line III) as a function x and of $GaAs_{1-y}Sb_y$ (line IV) as a function of y.

The results of single- and double-crystal X-ray measurements of lattice parameters and of low-temperature photoluminescence measurements of bandgap energies are shown in FIGS. 2 and 3. All measurements were made on single epitaxial layers ∼2 μm thick. In FIG. 2 the measured lattice parameter values are plotted versus the atom fraction of Sb in the melt ($X_{Sb}^{liq}$). The lattice parameter of GaAsSb is assumed to follow Vegard's law, thus determining the placement of the second scale, Sb mole fraction (y) in the $GaAs_{1-y}Sb_y$ crystal. The Al concentration scale at the top of FIG. 2 shows the fraction of Al in AlGaAs needed to give the same room temperature lattice parameter values and is included for reference purposes. Essentially, perfect lattice matching of a $GaAs_{1-y}Sb_y$ active layer to $Al_{0.4}Ga_{0.6}As$ confining layers at room temperature occurs at y=0.0066.

The photoluminescence bandgap determination was made using the exciton peak at 5.5 degrees Kelvin and in FIG. 3 has been scaled to room temperature values using the temperature dependence of the bandgap of GaAs. Good agreement is found with the bandgap energy vs. composition determination, shown as the dashed line IV in FIG. 3. The linear relationship assumed between y and $X_{Sb}^{liq}$ agrees with published phase diagrams to within 15 percent. At $y \geq 0.018$, dislocation networks are apparent in the top surface morphology for layer thicknesses greater than ∼0.1 μm.

An unexpected result that could not be predicted from the thermodynamic relationships was the approximately two to three times apparently faster growth rate for the active layer of laser structures for layers grown from solutions with $X_{Sb}^{liq} > 0.02$ compared to those grown with $X_{Sb}^{liq} < 0.005$. The epitaxial layer thicknesses were determined by scanning electron microscopy and compared as a function of the total temperature drop during the time of the layer growth, for furnace cooling rates between 0.01 and 0.1 degrees Celsius/min. One possible explanation for the faster growth rate is that Sb in the growth melt improves the initial nucleation at the start of the growth of the active layer. As a consequence, the thickness uniformity of very thin layers containing Sb may be statistically superior to that of comparable thickness binary GaAs layers; i.e., the modulations of the thickness known as rake lines were not observed in the GaAsSb wafers.

The average lasing current thresholds $I_{th}$ for devices from several wafers of varying Sb concentration were measured: for $y \approx 0.0005$, $I_{th}$ ranged from about 90–120 mA; for $y \approx 0.005$, $I_{th}$ ranged from about 90–105 mA; and at $0.016 \leq y \leq 0.019$, $I_{th}$ was about 80 mA.

The initial Sb devices tested were grown with undoped active layers and had emission wavelengths of 0.86–0.89 μm. By doping the active layer to $\sim 1 \times 10^{18}$ $cm^{-3}$, with Ge, for example, emission wavelengths of 0.92 μm should be obtainable with y=0.0066.

The reliability of lasers with y>0.004 up to and even slightly beyond the concentration where dislocation networks formed was significantly better than that of comparably produced binary GaAs active layer lasers, with the best result thus far at y=0.006. The lifetimes were determined by the failure to emit 3 mW of light for drive currents less than 350 mA dc in a dry $N_2$ ambient at 70 degrees Celsius. The lifetime at 20 degrees Celsius was projected using an extrapolation energy of 0.7 eV.

It should be noted, however, that the problem of infant failures for binary GaAs lasers remains a problem for GaAsSb active layer lasers. Between 20 and 50 percent of the devices from most wafers died in under ten hours. This result seems to be independent of Sb concentration, method of crystal growth, or laboratory for longer wavelength GaAs lasers. For most practical purposes such infant failures can be eliminated by well-known burn-in techniques.

Most of the wafers tested produced lasers which had the median of the lifetime distribution near $10^5$ hours. However, the addition of Sb to the active layer is not a sufficient condition for ensuring longer laser lifetimes, and thus two wafers within the proper range of Sb concentrations did not have significantly improved median lifetimes. The degradation mechanism for most of the failed devices was dark line defects.

It has been proposed that the degradation in prior art AlGaAs lasers may be due to stress or stress gradients and that the demonstrated improvements in laser reliability with small additions of Al to the active layer are due to the changes in the active layer stress. Specifically, tensile stress in the vicinity of the active layer seems to be detrimental. Attempts to control the active layer stress other than by Al additions have generally been to alter the confinement layer lattice parameter by P additions (M. B. Panish et al, U.S. Pat. No. 3,958,263) which are difficult to control in LPE. In accordance with one aspect of my invention, on the other hand, the active layer is lattice matched to the confinement layer, and essentially all epitaxial layer induced stress gradients are removed from the vicinity of the active layer. The simple addition of nonvolatile Sb to the active layer growth melt accomplishes this result and also pushes the bandgap energy and the index of refraction in the desired directions.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the beneficial effects of the Sb additions to the active layer are not expected to be restricted to material produced by the LPE process, nor to the specific LPE growth temperature discussed in the example.

This application was filed concurrently with W-T. Tsang Case 11, Ser. No. 220,011, entitled "AlGaAs/InGaAs/AlGaAs Light Emitting Structure."

What is claimed is:

1. In a light emitting diode, a semiconductor body comprising
    first and second $Al_xGa_{1-x}As$ semiconductor cladding layers of opposite conductivity type, and
    an intermediate semiconductor region between and contiguous with said cladding layers,
    said intermediate region including a narrower bandgap $Al_zGa_{1-z}As_{1-y}Sb_y$ active layer capable of emitting radiation when said cladding layers are forward biased and pumping current is applied thereto,
    the amount y of Sb in said active layer being mutually adapted with the thicknesses of said layers and said region so as to place said active layer under compression at the operating temperature of said diode.

2. The body of claim 1 wherein the y and z in said active layer are adapted so that the wavelength of said radiation is in the range of approximately 0.87–0.92 μm.

3. The body of claim 2 wherein z=0 and said active layer therefore comprises $GaAs_{1-y}Sb_y$.

4. The body of claim 1 wherein y and z in said active layer are adapted so that the wavelength of said radiation is in the visible.

5. The body of claims 1, 2, 3, or 4 wherein $0.001 \leq y \leq 0.02$.

6. The body of claim 5 wherein $(x-z) \geq 0.20$ and $y \geq 0.004$.

7. The body of claim 1 wherein the amount y of Sb in said active layer reduces to essentially zero the lattice mismatch between said active layer and said cladding layers.

8. The body of claim 7 wherein $y \approx 0.016(x-z)$.

9. A semiconductor laser diode comprising
    first and second $Al_xGa_{1-x}As$, $x \geq 0.20$ cladding layers of opposite conductivity type,
    an intermediate semiconductor region between and contiguous with said cladding layers,
    said intermediate region including a narrower bandgap $GaAs_{1-y}Sb_y$ active layer, $0.001 \leq y \leq 0.02$, capable of emitting radiation when said cladding layers are forward biased and pumping current is applied thereto,
    the amount y of Sb being mutually adapted with the thicknesses of said layers and said region to place said active layer under compression at the operating temperature of said diode,
    electrode means for applying forward bias voltage and current to said cladding layers, and
    optical feedback means for generating stimulated emission of said radiation.

10. The laser diode of claim 9 wherein said active layer is adapted to emit radiation at a free space wavelength in the range of approximately 0.87–0.92 μm.

11. The laser diode of claim 9 wherein the thickness of said active layer is in the range of approximately 0.1–0.4 μm.

12. The laser diode of claims 9, 10, or 11 including means for constraining said pumping current to flow in a relatively narrow channel through said active layer.

13. A semiconductor laser with enhanced lifetime comprising
    a GaAs body,
    a first cladding layer comprising $n-Al_xGa_{1-x}As$ epitaxially grown on said body, $x \geq 0.20$,
    an active layer comprising $GaAs_{1-y}Sb_y$ epitaxially grown on said first cladding layer to a thickness in the range of approximately 0.1–0.4 μm, with $0.001 \leq y \leq 0.02$,
    a second cladding layer comprising $p-Al_xGa_{1-x}As$ grown on said active layer, $x \geq 0.20$,
    a relatively high conductivity p-GaAs contact-facilitating layer epitaxially grown on said second cladding layer,
    the amount y of Sb being mutually adapted with the thicknesses of said body and said layers so as to place said active layer under compression at the operating temperature of said laser,
    electrode means formed on said substrate and on said contact facilitating layer for applying forward bias voltage to said cladding layers and pumping current to said active region, thereby causing said active region to emit radiation at a wavelength in the range of about 0.87–0.92 μm,
    means for constraining said pumping current to flow in a relatively narrow channel through said active layer, and
    an optical feedback means for causing stimulated emission of said radiation.

* * * * *

UNITED STATES PATENT AND TRADEMARK OFFICE
CERTIFICATE OF CORRECTION

PATENT NO. : 4,386,429

DATED : May 31, 1983

INVENTOR(S) : Philip J. Anthony

It is certified that error appears in the above—identified patent and that said Letters Patent is hereby corrected as shown below:

In the Abstract, lines 2-3, "comprising" should read --comprises--; line 3, "$0.001 \leq y \leq 0.02$" should read --$0.001 \sim y \sim 0.02$--; line 5, "$(x-z) \leq 0.20$" should read --$(x-z) \sim 0.20$--. Column 1, line 21, "$\leq 1$ db/km" should read --$\sim 1$ db/km--; line 30, no paragraph; line 66, "$z = 0.15$" should read --$z \sim 0.15$--; line 68, "$\leq 0.78$ μm" should read --$\sim 0.78$ μm--. Column 2, line 17, "$0.001 \leq y \leq 0.02$" should read --$0.001 \sim y \sim 0.02$--; line 18, "$(z = 0.15)$" should read --$(z \sim 0.15)$--; line 18, "$(z = 0.15)$" should read --$(z \sim 0.15)$--; line 38, "$0.001 \leq y \leq 0.02$" should read --$0.001 \sim y \sim 0.02$--; line 42, "$0.2 \leq x \leq 0.6$" should read --$0.2 \sim x \sim 0.6$--; line 65, "$x^{liq}$" should read --$x^{liq}$--; line 66, "GaAs$_{1-y}$Sb$_y^{Sb}$" should read --GaAs$_{1-y}$Sb$_y$--. Column 3, line 16, "latticed" should read --lattice--. Column 4, line 64, "$0.001 \leq y \leq 0.02$" should read --$0.001 \sim y \sim 0.02$--. Column 5, line 4, "$0.2 \leq (x-z) \leq 0.4$" should read --$0.2 \sim (x-z) \sim 0.4$--; line 16, "$0.004 \leq y \leq 0.02$" should read --$0.004 \sim y \sim 0.02$--. Column 6, line 6, "$y \leq 0.018$" should read --$y \sim 0.018$--; line 31, "$0.016 \leq y \leq 0.019$" should read --$0.016 \sim y \sim 0.019$--. Column 7, line 56, "$0.001 \leq y \leq 0.02$" should read --$0.001 \sim y \sim 0.02$--; line 57, "$(x-z) \leq 0.20$" should read --$(x-z) \sim 0.20$--; line 58, "$y \leq 0.004$" should read --$y \sim 0.004$--. Column 8, line 5, "$x \leq 0.20$" should read --$x \sim 0.20$--; line 10, "$0.001 \leq y \leq 0.02$" should read --$0.001 \sim y \sim 0.02$--; line 35, "$x \leq 0.20$" should read --$x \sim 0.20$--; line 39, "$0.001 \leq y \leq 0.02$" should read --$0.001 \sim y \sim 0.02$--; line 41, "$x \leq 0.20$" should read

UNITED STATES PATENT AND TRADEMARK OFFICE
CERTIFICATE OF CORRECTION

PATENT NO. : 4,386,429

DATED : May 31, 1983

INVENTOR(S) : Philip J. Anthony

It is certified that error appears in the above—identified patent and that said Letters Patent is hereby corrected as shown below:

--$x \gtrsim 0.20$--.

Signed and Sealed this

Twenty-seventh Day of September 1983

[SEAL]

Attest:

GERALD J. MOSSINGHOFF

Attesting Officer — Commissioner of Patents and Trademarks